United States Patent
Clevenger et al.

(10) Patent No.: US 9,966,308 B2
(45) Date of Patent: May 8, 2018

(54) SEMICONDUCTOR DEVICE AND METHOD OF FORMING THE SEMICONDUCTOR DEVICE

(71) Applicant: International Business Machines Corporation, Armonk, NY (US)

(72) Inventors: Lawrence A. Clevenger, LaGrangeville, NY (US); Baozhen Li, South Burlington, VT (US); Kirk David Peterson, Jericho, VT (US); John E. Sheets, II, Zumbrota, MN (US); Junli Wang, Slingerlands, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/285,212

(22) Filed: Oct. 4, 2016

(65) Prior Publication Data

US 2018/0096890 A1 Apr. 5, 2018

(51) Int. Cl.
*H01L 21/768* (2006.01)
*H01L 21/285* (2006.01)
*H01L 21/3105* (2006.01)
*H01L 21/311* (2006.01)
*H01L 23/528* (2006.01)
(Continued)

(52) U.S. Cl.
CPC .. *H01L 21/76882* (2013.01); *H01L 21/28556* (2013.01); *H01L 21/28568* (2013.01); *H01L 21/31055* (2013.01); *H01L 21/31111* (2013.01); *H01L 21/76802* (2013.01); *H01L 21/76829* (2013.01); *H01L 21/76846* (2013.01); *H01L 23/528* (2013.01); *H01L 23/5226* (2013.01); *H01L 23/53238* (2013.01)

(58) Field of Classification Search
CPC ........ H01L 21/76882; H01L 21/76802; H01L 21/76846; H01L 21/76829; H01L 23/528; H01L 23/5226; H01L 23/53238
See application file for complete search history.

(56) References Cited

U.S. PATENT DOCUMENTS

| 5,654,232 | A | 8/1997 | Gardner |
| 5,904,565 | A | 5/1999 | Nguyen et al. |
| 6,204,179 | B1 | 3/2001 | McTeer |

(Continued)

OTHER PUBLICATIONS

Anonymous, "Method for Integrating Transistors with a First-Layer Cu Interconnect", IPCOM000020731D Dec. 10, 2003.

(Continued)

*Primary Examiner* — Savitr Mulpuri
(74) *Attorney, Agent, or Firm* — Vazken Alexanian; McGinn IP Law Group, PLLC

(57) ABSTRACT

A method of forming a semiconductor device includes forming a sacrificial layer in a first contact hole of a first dielectric layer, forming a second dielectric layer on the first dielectric layer, and forming a second contact hole in the second dielectric layer, the second contact hole being aligned with the first contact hole, removing the sacrificial layer from the first contact hole, forming a liner layer on the second dielectric layer and in the first and second contact holes, and forming a copper contact in the first and second contact holes.

12 Claims, 18 Drawing Sheets

(51) Int. Cl.
*H01L 23/522* (2006.01)
*H01L 23/532* (2006.01)

(56) References Cited

U.S. PATENT DOCUMENTS

| | | | |
|---|---|---|---|
| 6,211,085 B1 | 4/2001 | Liu | |
| 7,115,999 B2 | 10/2006 | Tsumura et al. | |
| 7,186,643 B2 | 3/2007 | Ahn et al. | |
| 7,432,195 B2 * | 10/2008 | Suzuki | C23C 16/16 |
| | | | 257/E21.17 |
| 7,514,354 B2 | 4/2009 | Park et al. | |
| 7,629,264 B2 | 12/2009 | Bonilla | |
| 7,737,026 B2 | 6/2010 | Li et al. | |
| 8,242,600 B2 * | 8/2012 | Yang | H01L 21/76843 |
| | | | 257/751 |
| 8,278,173 B2 * | 10/2012 | Lim | H01L 29/66545 |
| | | | 257/E21.632 |
| 8,691,689 B1 | 4/2014 | Besser et al. | |
| 8,736,056 B2 * | 5/2014 | Lee | H01L 21/76802 |
| | | | 257/751 |
| 8,749,060 B2 * | 6/2014 | Lee | H01L 23/53233 |
| | | | 257/734 |
| 9,514,928 B2 * | 12/2016 | Chi | H01L 21/02107 |
| 2010/0072623 A1 | 3/2010 | Prindle et al. | |
| 2012/0181692 A1 | 7/2012 | Heinrich et al. | |
| 2012/0273851 A1 | 11/2012 | Hong et al. | |
| 2015/0203961 A1 | 7/2015 | Ha et al. | |
| 2015/0270176 A1 | 9/2015 | Xie et al. | |
| 2016/0071791 A1 | 3/2016 | Huang et al. | |
| 2016/0240568 A1 * | 8/2016 | Hung | H01L 27/1463 |

OTHER PUBLICATIONS

Mikagi et al."Barrier Metal Free Copper Damascene Interconnection Technology Using Atmospheric Copper Reflow and Nitrogen Doping in Siof Film", in Proc. IEEE IEDM'96., pp. 365-368 (1996).

Yang et al., "Characterization of Cu Reflows on Ru", IEEE Electron Device Letters, 32(10), pp. 1430-1432 (2011).

Itoh et al., "Copper Filling of Deep Submicrometer Trenches with Ruthenium-Lined Barrier Metal by High-Vacuum Magnetron Sputtering Using Argon Gas with Added Oxygen", Jap. J. of Appl. Phys., 51(2R), pp. 025701-1 to 025701-4 (2012).

Itoh et al.,"Cu Filling of 10 Nm Trenches by High-Magnetic-Field Magnetron Sputtering", Jap. J. of Appl. Phys.,53(5S2), pp. 05GA04-1 to 05GA04-5 (2014).

Itoh et al., "Cu Filling Into Trenches with Co (00.2) Layer by Using High-Vacuum Magnetron Sputtering in $N_2$-Addded Ar Gas", Applied Surface Science, 354, pp. 124-128 (2015).

Kokaze et al., "Performance of Integrated Cu Gap-Filling Process with Chemical Vapor Deposition Cobalt Liner", Jap. J. of Appl. Phys,,52(5S3), pp. 05FA01-1 to 05FA01-4 (2013).

United States Office Action dated Feb. 13, 2018, in U.S. Appl. No. 15/858,752.

* cited by examiner

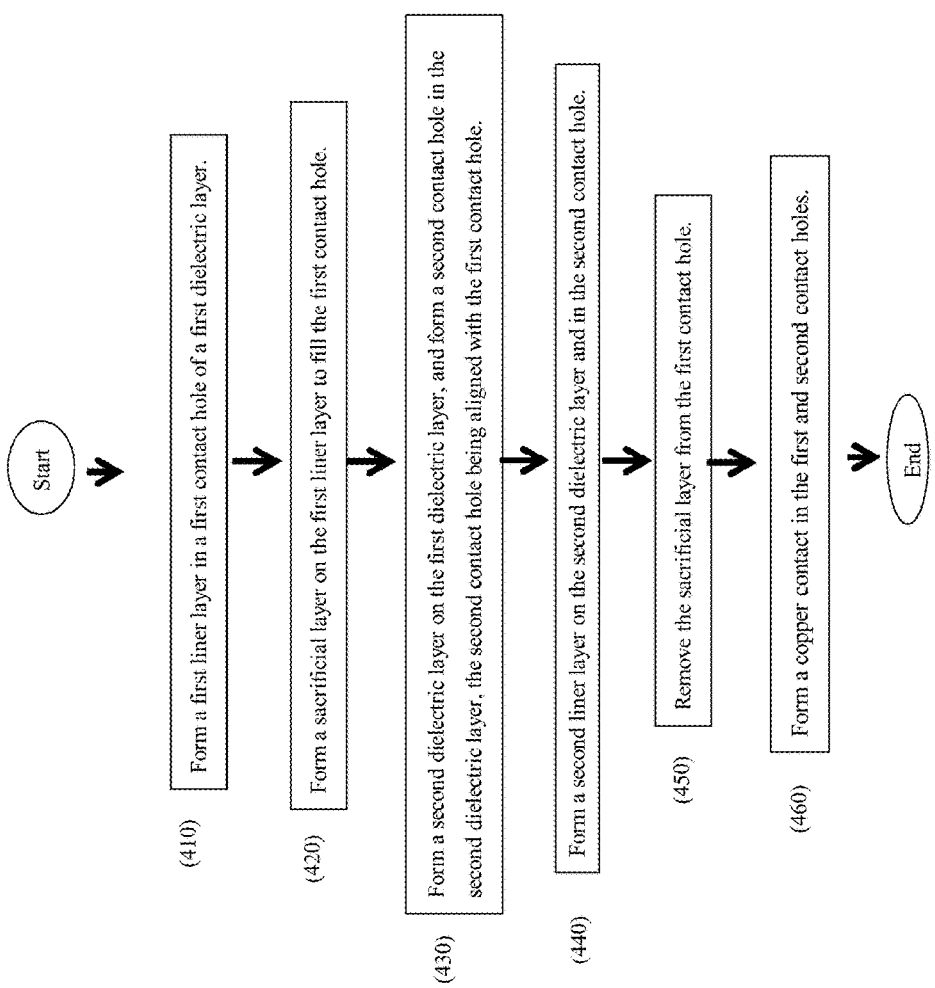

SEMICONDUCTOR DEVICE AND METHOD OF FORMING THE SEMICONDUCTOR DEVICE

BACKGROUND

The present invention relates generally to semiconductor device and method of forming a semiconductor device and, more particularly, to a method of forming a semiconductor device which includes forming a copper contact in first and second contact holes in first and second dielectric layers, respectively.

In a related art method of forming a semiconductor device, a first plurality of trenches is formed in a first dielectric layer, a first plurality of contacts is formed in the plurality of trenches, and the first plurality of contacts are planarized. A second dielectric layer is then formed on the first dielectric layer, and a second plurality of trenches is formed in the second dielectric layer 13 so as to be aligned with the first plurality of contacts. A second plurality of contacts is then formed in the second plurality of trenches.

SUMMARY

An exemplary aspect of the present invention is directed to a method of forming a semiconductor device includes forming a sacrificial layer in a first contact hole of a first dielectric layer, forming a second dielectric layer on the first dielectric layer, and forming a second contact hole in the second dielectric layer, the second contact hole being aligned with the first contact hole, removing the sacrificial layer from the first contact hole, forming a liner layer on the second dielectric layer and in the first and second contact holes, and forming a copper contact in the first and second contact holes.

Another exemplary aspect of the present invention is directed to a method of forming a semiconductor device, including forming a first liner layer in a first contact hole of a first dielectric layer, forming a sacrificial layer on the first liner layer to fill the first contact hole, forming a second dielectric layer on the first dielectric layer, and forming a second contact hole in the second dielectric layer, the second contact hole being aligned with the first contact hole, forming a second liner layer on the second dielectric layer and in the second contact hole, removing the sacrificial layer from the first contact hole, and forming a copper contact in the first and second contact holes.

Another exemplary aspect of the present invention is directed to a semiconductor device, including a first dielectric layer comprising a first contact hole, a second dielectric layer formed on the first dielectric layer, and comprising a second contact hole aligned with the first contact hole; and a reflowed copper layer formed in the first and second contact holes.

With its unique and novel features, the exemplary aspects of the present invention may provide an interface-free metal layer across plurality of levels.

BRIEF DESCRIPTION OF THE DRAWINGS

The exemplary aspects of the present invention will be better understood from the following detailed description of the exemplary embodiments of the invention with reference to the drawings, in which:

FIG. 4 illustrates a method 400 of forming a semiconductor device, according to an exemplary aspect of the present invention.

DETAILED DESCRIPTION

Figure 1:
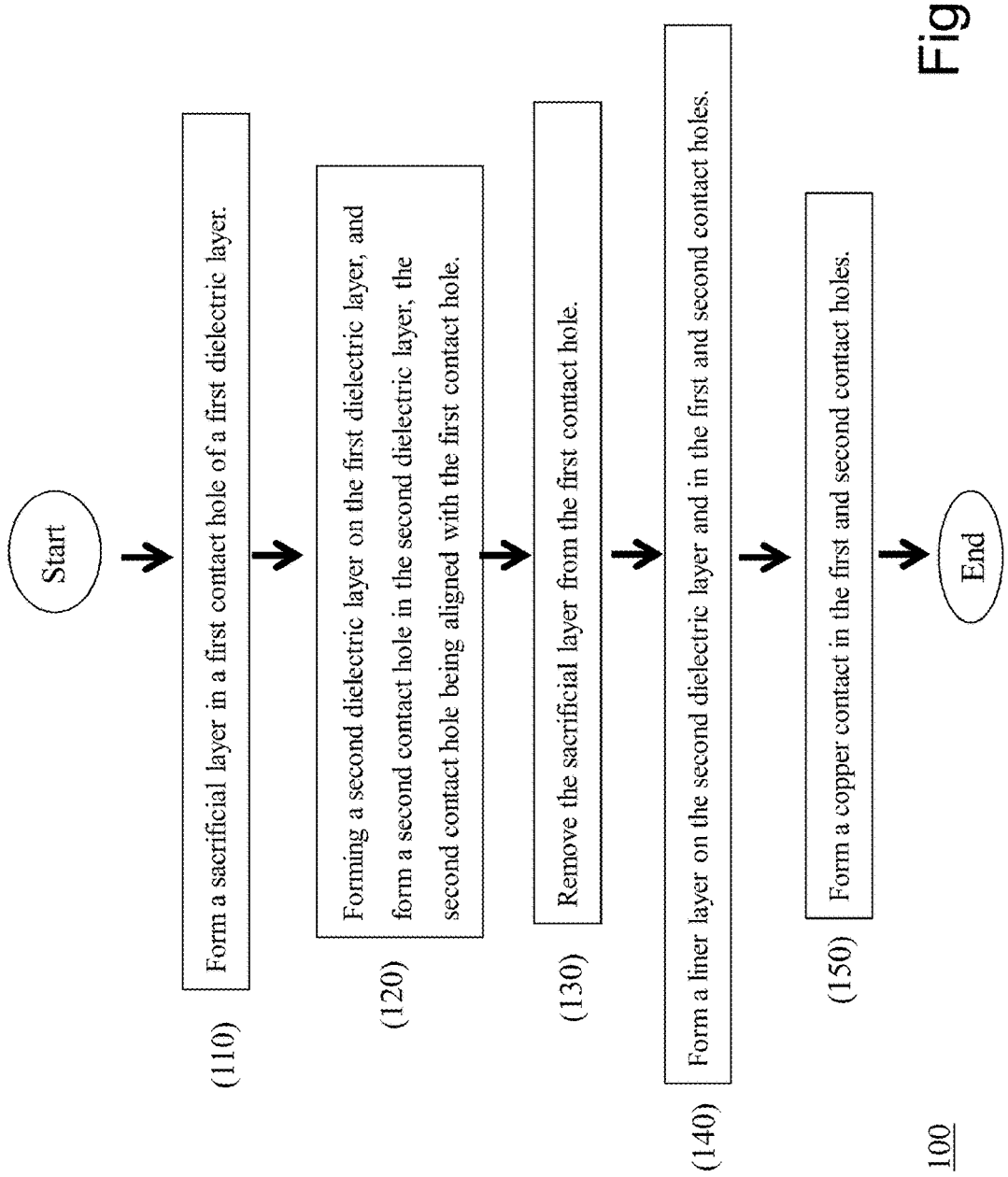
FIG. 1 illustrates a method 100 of forming a semiconductor device, according to an exemplary aspect of the present invention.

The invention will now be described with reference to FIGS. 1-6D, in which like reference numerals refer to like parts throughout. It is emphasized that, according to common practice, the various features of the drawing are not necessarily to scale. On the contrary, the dimensions of the various features can be arbitrarily expanded or reduced for clarity. Exemplary embodiments are provided below for illustration purposes and do not limit the claims.

A problem with the related art method of forming a semiconductor device is that the use of two different contacts has an increased resistance as compared to one continuously formed contact. Such increased resistance may result in an increased resistance of contacts to devices as technology scales.

An exemplary aspect of the present invention may solve this problem of the related art devices. In particular, an exemplary aspect of the present invention may provide a method of using a continuously formed contact, instead of different contacts. That is, for example, the metallization (e.g., copper) from M1 may become part of the contact to the devices.

FIG. 1 illustrates a method 100 of forming a semiconductor device, according to an exemplary aspect of the present invention.

As illustrated in FIG. 1, the method 100 includes forming (110) a sacrificial layer in a first contact hole of a first dielectric layer (e.g., a contact-to-active area (CA) dielectric layer), forming (120) a second dielectric layer (e.g., a V0 dielectric layer, M1 dielectric layer, etc.) on the first dielectric layer, and forming a second contact hole in the second dielectric layer, the second contact hole being aligned with the first contact hole, removing (130) the sacrificial layer from the first contact hole, forming (140) a liner layer on the second dielectric layer and in the first and second contact holes, and forming (150) a copper contact in the first and second contact holes.

It should be noted that the "forming" of a layer or "depositing" of a layer as described herein may be understood to mean include physical vapor deposition (PVD), chemical vapor deposition (CVD) or atomic layer deposition (ALD). In addition, the terms "removing" or "stripping" of a layer or part of a layer may be understood to include etching such as wet etching, dry etching, reactive ion etching (RIE), etc.

The forming (140) of the liner layer may be performed, for example, by using atomic layer deposition (ALD). The liner layer may include, for example, a TaN liner layer formed on the second dielectric layer and in the first and second contact holes, and a wetting liner layer (e.g., Ru, Co, Rh, etc.) formed on the TaN liner layer.

The forming (150) of the copper contact may include depositing a copper layer on the wetting liner layer, and reflowing the copper layer into the first and second contact holes. The reflowing of the copper layer may be performed at a temperature in a range from 200° C. to 450° C., and for a duration in a range of 30 minutes to 3 hours, and in an atmosphere including one of nitrogen and a mixture of nitrogen and hydrogen.

The method 100 may also include forming the first dielectric layer, planarizing a surface of the first dielectric layer by chemical mechanical polishing (CMP), forming a nitride cap on the surface of the first dielectric layer, patterning and etching the first dielectric layer to form the first contact hole, and depositing a TaN liner and performing etch back to remove the TaN liner from a side wall of the first contact hole.

FIGS. 2A-2F illustrate a method of forming a semiconductor device, according to another exemplary aspect of the present invention.

Figure 2A:
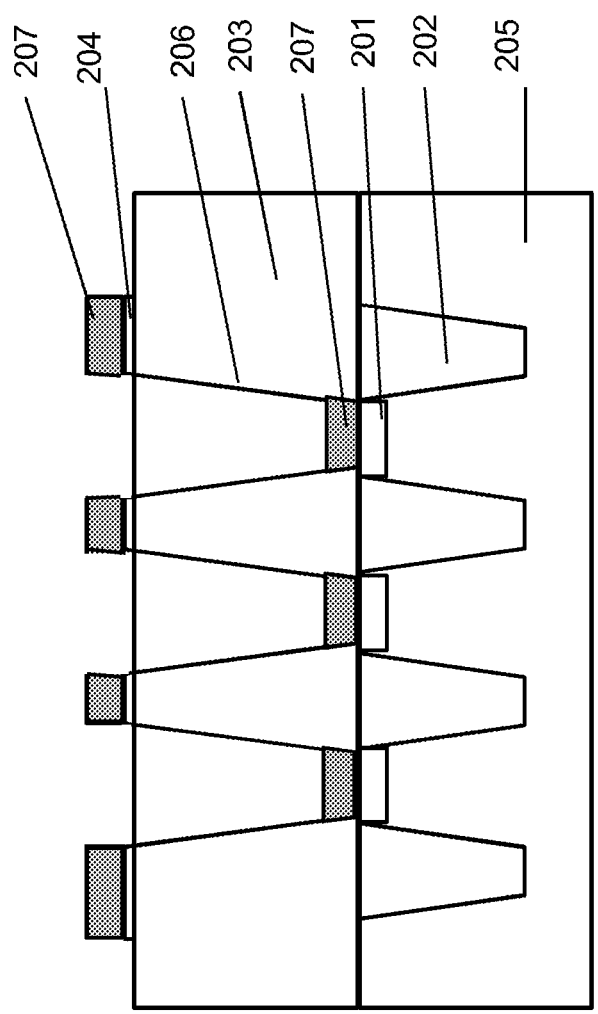
FIG. 2A illustrates the forming of a contact hole 206, according to an exemplary aspect of the present invention.

In particular, FIG. 2A illustrates the forming of a contact hole 206, according to an exemplary aspect of the present invention.

For example, the contact hole 206 may be aligned with an active area 201 on a substrate 205 (e.g., silicon). The active area 201 may include active devices such as transistors, diodes, etc. For example, the active area 201 may include logic devices, memory devices, etc. Isolation areas 202 (e.g., shallow trench isolations (STI) such as silicon oxide) may be formed in the substrate 205 and separate the active areas 201. In particular, the contact hole 206 may be used to contact a diffusion region or gate of a transistor on the active region 201.

A dielectric layer 203 may be formed (e.g., deposited) on the substrate 205. The dielectric layer 203 may include, for example, an oxide such as silicon oxide. The dielectric layer 203 may be planarized (e.g., by CMP), and a nitride cap 204 (e.g., silicon nitride) may be formed on the dielectric layer 203.

The dielectric layer 203 may then be patterned and etched to form the contact holes 206 (e.g., contact-to-active area (CA)). A TaN liner 207 may then be deposited (e.g., by PVD) and etched back (e.g., by isotropic etch back) to remove the TaN liner 207 from the side walls of the contact hole 206.

Figure 2B:
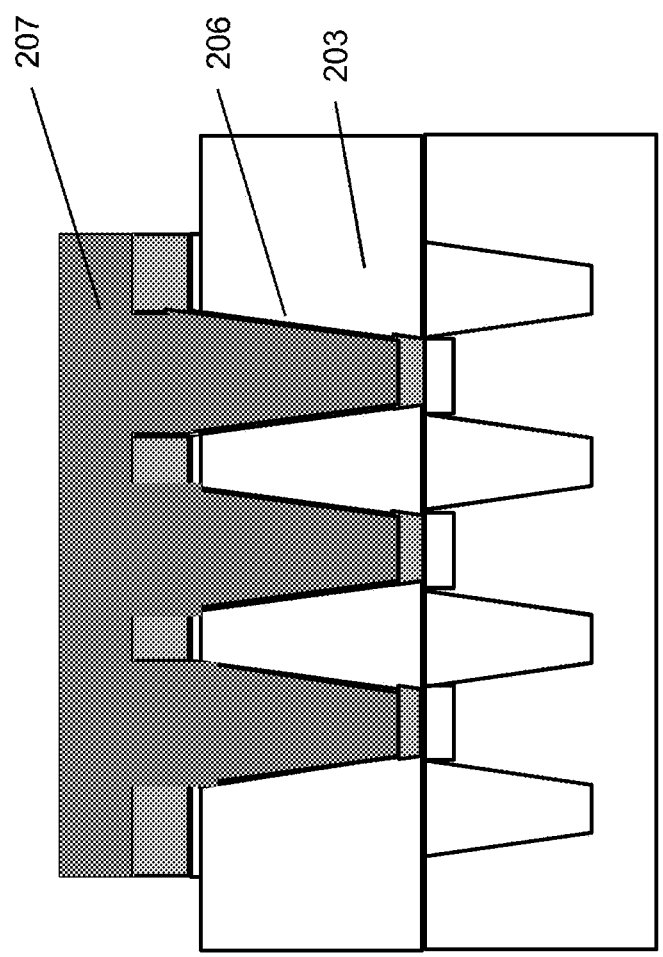
FIG. 2B illustrates the forming of a sacrificial layer 208 according to an exemplary aspect of the present invention.

FIG. 2B illustrates the forming of a sacrificial layer 208 according to an exemplary aspect of the present invention.

As illustrated in FIG. 2B, the sacrificial layer 208 may be formed on the dielectric layer 203 and in the contact holes 206. The sacrificial layer 208 may include, for example, a deposited layer of silicon.

Figure 2C:
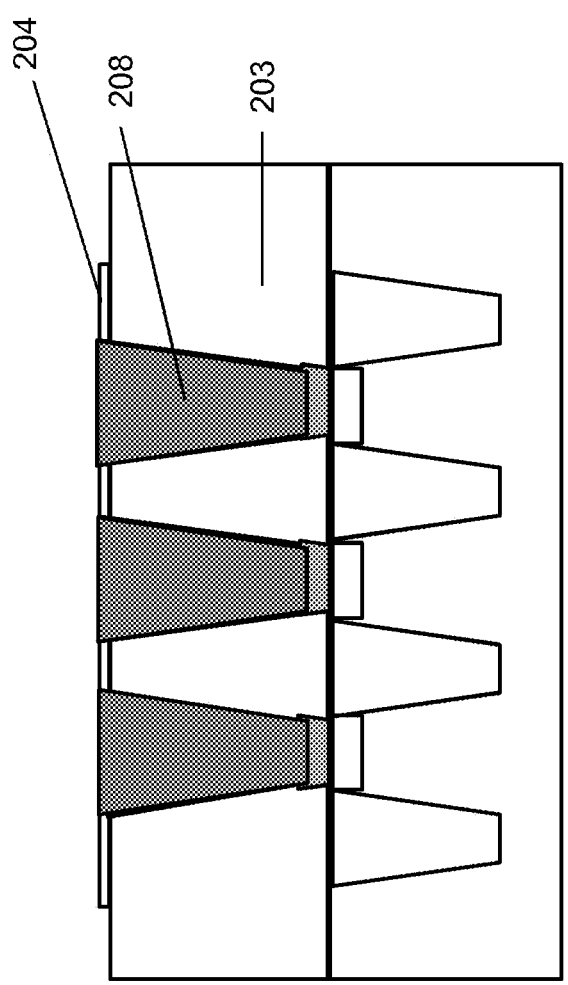
FIG. 2C illustrates the planarizing of (e.g., removal of) the sacrificial layer 308, according to an exemplary aspect of the present invention.

FIG. 2C illustrates the planarizing of (e.g., removal of) the sacrificial layer 208, according to an exemplary aspect of the present invention.

As illustrated in FIG. 2C, the sacrificial layer 208 may be planarized so as to have an upper surface that is co-planar with an upper surface of the nitride cap 204. The planarization may also remove the TaN liner 207 from the upper surface of the dielectric layer 203 (e.g., off of the nitride cap 204). The sacrificial layer 208 may be planarized, for example, by etch back or CMP.

Figure 2D:
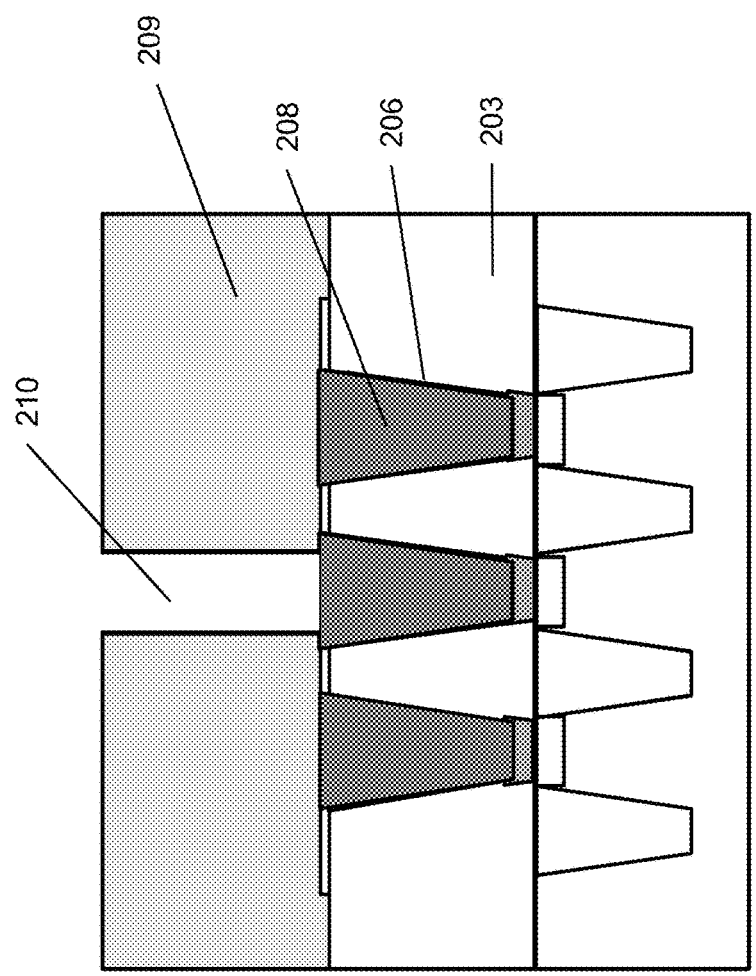
FIG. 2D illustrates the depositing of a dielectric layer 209, according to an exemplary aspect of the present invention.

FIG. 2D illustrates the depositing of a dielectric layer 209, according to an exemplary aspect of the present invention.

As illustrated in FIG. 2D, the dielectric layer 209 may be formed on the dielectric layer 203. A contact hole 210 may be then be etched in the dielectric layer 209 so as to be aligned with a contact hole 206 (which is filled with the sacrificial layer 208) in the dielectric layer 203.

The dielectric layer 209 may be, for example, an inter-layer dielectric (e.g., $SiO_2$), a V0 dielectric layer or a M1 dielectric layer. The contact hole 210 may include, for example, a via or a trench.

It should be noted that although only one contact hole 210 is illustrated in FIG. 2D, there could be a plurality of contact holes 210 formed in the dielectric layer 209 and aligned (e.g., mated) with a plurality of contact holes 206 in the dielectric layer 203, respectively. It should also be noted that where a contact hole 210 is not formed to be aligned with a contact hole 206, then that contact hole 206 may remain filled with the sacrificial layer 208, as illustrated in FIG. 2D. Such a sacrificial layer-filled contact hole 206 may be used, for example, for local strapping.

Figure 2E:
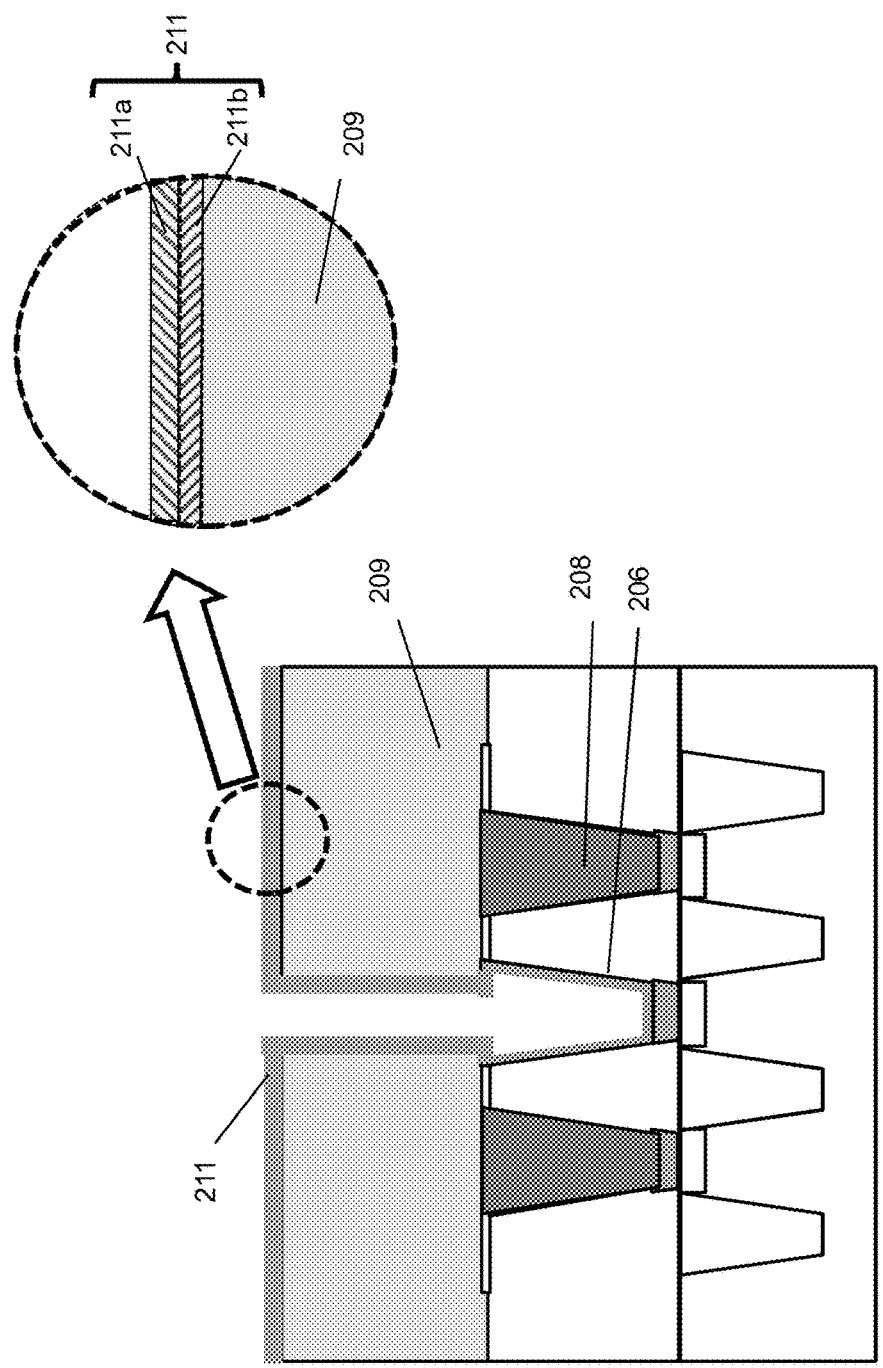
FIG. 2E illustrates the removing of the sacrificial layer 208, according to an exemplary aspect of the present invention.

FIG. 2E illustrates the removing of the sacrificial layer 208, according to an exemplary aspect of the present invention.

As illustrated in FIG. 2E, the sacrificial layer 208 may be removed (e.g., via etching) from the contact hole 206. Then, a liner 211 may be formed (e.g., conformally formed) on the dielectric layer 209 and on a sidewall of the contact hole 210 and on a sidewall of the contact hole 206. The liner 211 may be formed, for example, by ALD.

The liner 211 may have a thickness, for example, in a range of 0.5 nm to 5 nm. The liner 211 may include a plurality of layers. In particular, as illustrated in FIG. 2E, the liner 211 may include a TaN liner 211b formed on a surface of the dielectric layer 209 and on a sidewall of the contact hole 210 and on a sidewall of the contact hole 206. The TaN liner 211b may have a thickness in a range from 0.5 to 3 nm.

The liner 211 may also include a wetting liner 211a formed on the TaN liner 211b. The wetting liner 211a may include, for example, Ru, Co, Rh, etc., and may have a thickness in a range from 0.5 to 3 nm.

Figure 2F:
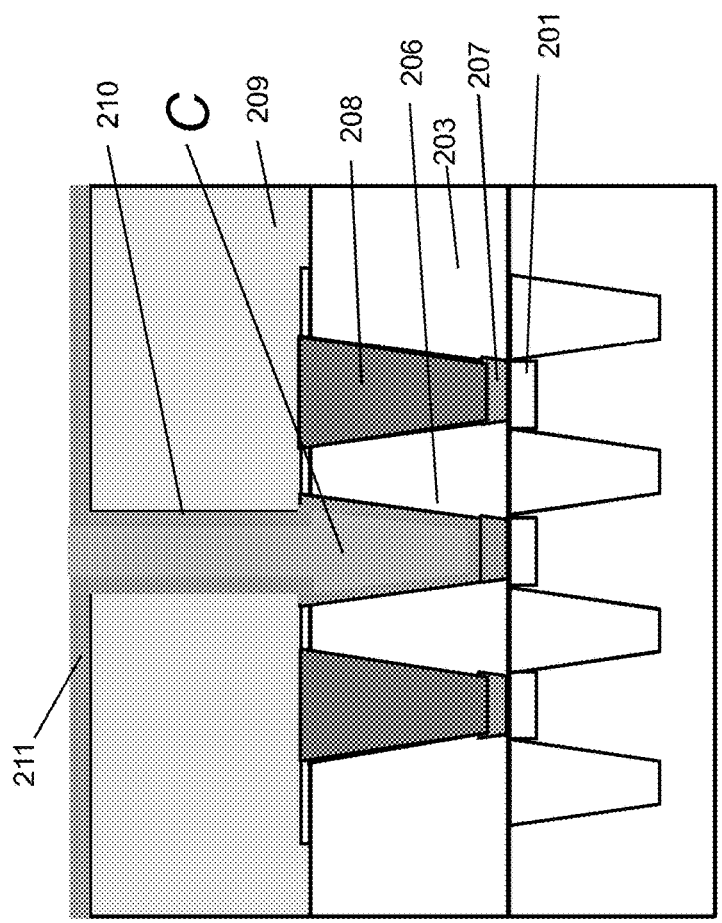
FIG. 2F illustrates the forming of a contact C, according to an exemplary aspect of the present invention.

FIG. 2F illustrates the forming of a contact C, according to an exemplary aspect of the present invention.

As illustrated in FIG. 2F, the contact C, may be formed on the liner 211 in the contact hole 206 and in the contact hole 210.

The contact C may include, for example, copper (e.g., a copper contact). That is, the contact C may include substantially pure copper or an alloy containing copper.

The contact C may be formed, for example, by depositing (e.g., flash depositing) a layer of copper on the dielectric layer 209, and then reflowing the copper into the contact hole 206 and the contact hole 210. The reflow of the copper may be performed, for example, at a temperature in a range from 200° C. to 450° C., and for a duration in a range of 30 minutes to 3 hours, and in an atmosphere including one of nitrogen and a mixture of nitrogen and hydrogen.

As illustrated in FIG. 2F, the contact C may extend continuously from near the active area 201 to near an upper surface of the dielectric layer 209. Thus, unlike the related art method which requires two different contacts (e.g., contact 120 and contact 140), an exemplary aspect of the present invention may fill both of the contact holes 206 and 210 with one continuously formed contact C. That is, an exemplary aspect of the present invention may provide an interface-free metal layer across a plurality of levels.

As illustrated in FIG. 2F, an exemplary aspect of the present invention does not necessarily include a liner between V0 (e.g., dielectric layer 209) and CA (e.g., dielectric layer 203). Further, the contact holes 206 which are not in contact with a contact hole 210 may stay filled with the sacrificial layer 208 and the TaN liner 207. The exemplary aspects of the present invention may also be used to form dual damascene with recursive features.

It should be noted that although two levels are illustrated in FIGS. 2A-2F, the present invention is not limited to only two layers, but could be used to continuously formed a copper contact through three (3) or more layers.

Figure 3:
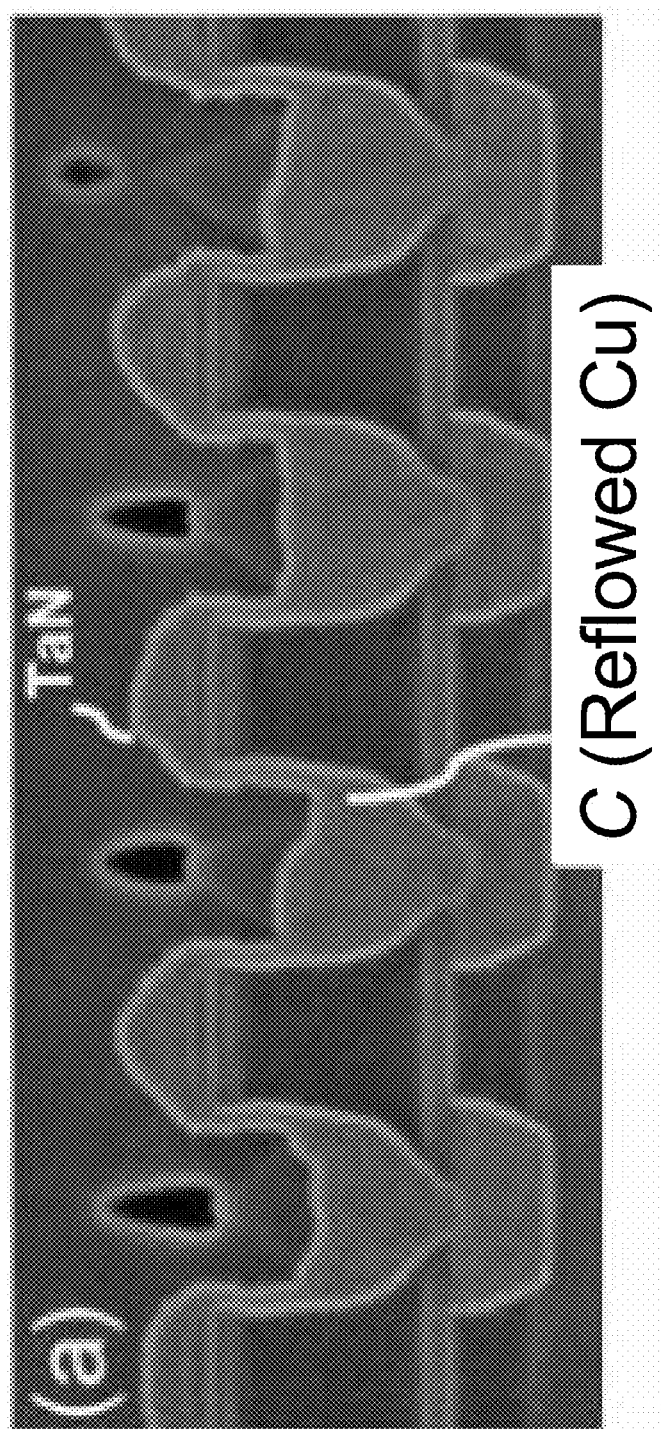
FIG. 3 provides a photograph of a contact C (e.g., reflowed copper), according to an exemplary aspect of the present invention.

Referring again to the drawings, FIG. 3 provides a photograph of a contact C (e.g., reflowed copper), according to an exemplary aspect of the present invention.

FIG. 4 illustrates a method 400 of forming a semiconductor device, according to an exemplary aspect of the present invention.

As illustrated in FIG. 4, the method 400 includes forming (410) a first liner layer in a first contact hole of a first dielectric layer, forming (420) a sacrificial layer on the first liner layer to fill the first contact hole, forming (430) a second dielectric layer on the first dielectric layer, and forming a second contact hole in the second dielectric layer, the second contact hole being aligned with the first contact hole, forming (440) a second liner layer on the second dielectric layer and in the second contact hole, removing (450) the sacrificial layer from the first contact hole, and forming (460) a copper contact in the first and second contact holes.

FIGS. 5A-5F illustrate a method of forming a semiconductor device, according to another exemplary aspect of the present invention.

Figure 5A:
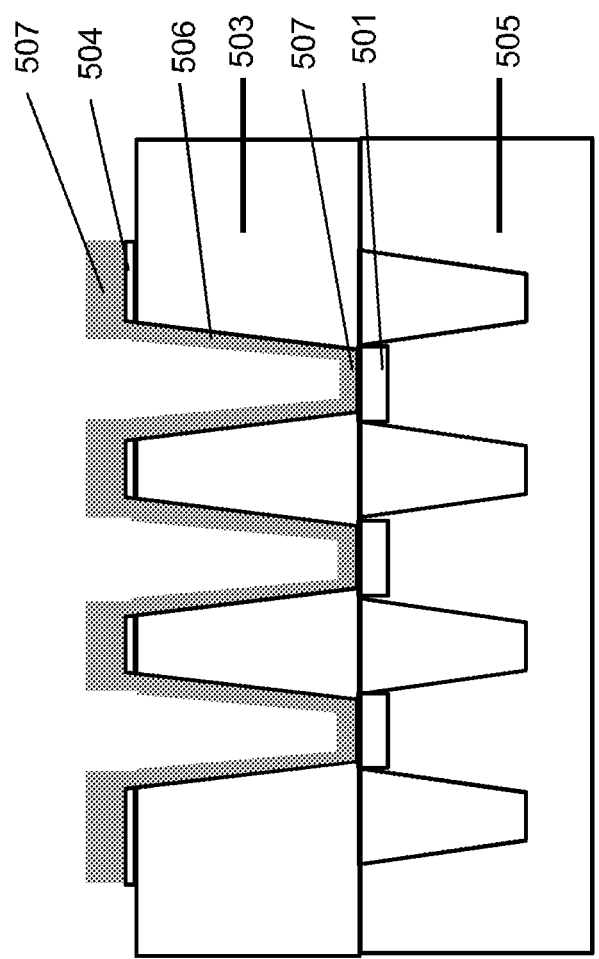
FIG. 5A illustrates the forming of a contact hole 506, according to an exemplary aspect of the present invention.

In particular, FIG. 5A illustrates the forming of a contact hole 506, according to an exemplary aspect of the present invention.

The contact hole 506 may be aligned with an active area 501 on a substrate 505 (e.g., silicon). A dielectric layer 503 may be formed (e.g., deposited) on the substrate 505. The dielectric layer 503 may be planarized (e.g., by CMP), and a nitride cap 504 (e.g., silicon nitride) may be formed on the dielectric layer 503.

The dielectric layer 503 may then be patterned and etched to form the contact holes 506 (e.g., contact-to-active area (CA)). A TaN liner 507 may then be deposited (e.g., by PVD). It should be noted that unlike the method illustrated in FIGS. 2A-2F, in this exemplary aspect, the TaN liner 507 is not removed from the side walls of the contact hole 506.

Instead of the TaN liner 507, a liner stack may be used. The liner stack may include a layer (e.g., a titanium layer) that acts as a reactive metal to reduce contact resistance with silicide formed on the active area 501, and TaN to act as a copper barrier. The liner stack may also include other metals such as refractory metals (e.g., tungsten).

Figure 5B:
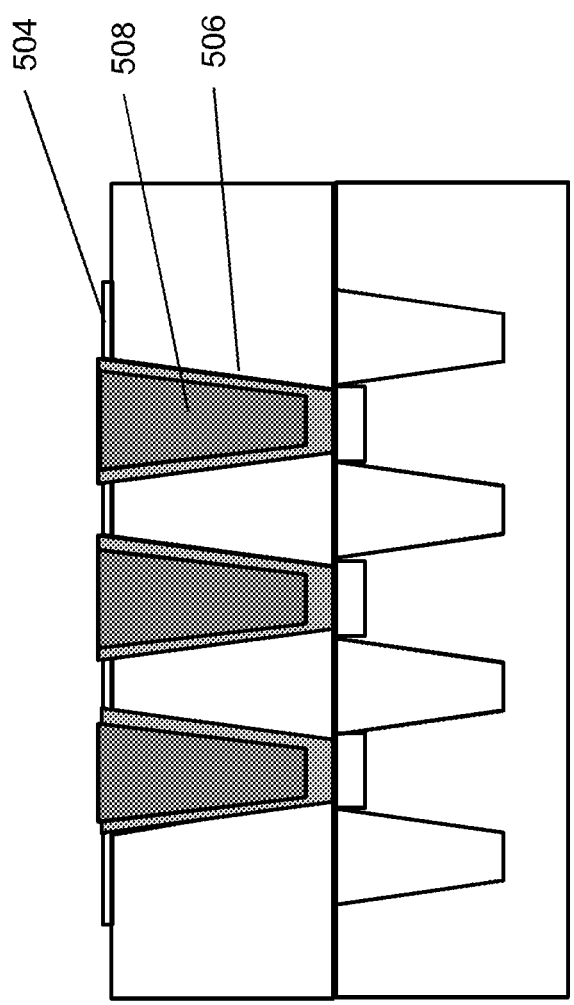
FIG. 5B illustrates the forming of a sacrificial layer 508, according to an exemplary aspect of the present invention.

FIG. 5B illustrates the forming of a sacrificial layer 508, according to an exemplary aspect of the present invention.

As illustrated in FIG. 5B, the sacrificial layer 508 (e.g., silicon) may be formed in the contact holes 506, and then planarized (e.g., by CMP), so that an upper surface of the sacrificial layer 508 is co-planar with an upper surface of the nitride cap 504.

Figure 5C:
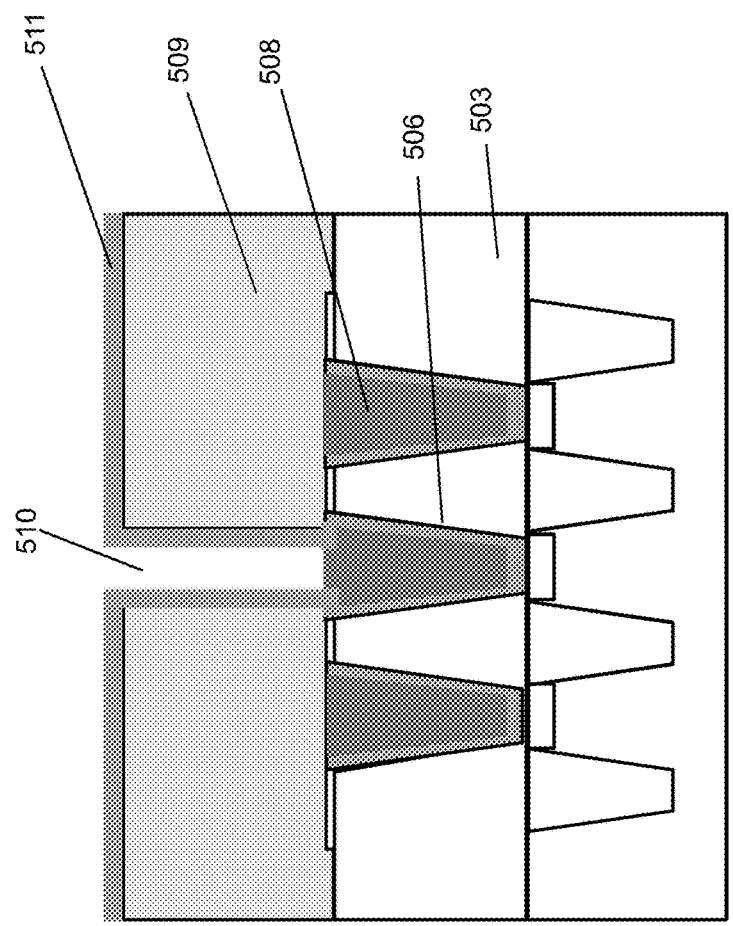
FIG. 5C illustrates the forming of a contact hole 510, according to an exemplary aspect of the present invention.

FIG. 5C illustrates the forming of a contact hole 510, according to an exemplary aspect of the present invention.

As illustrated in FIG. 5C, a dielectric layer 509 (e.g., interlayer dielectric layer, V0 dielectric layer, M1 dielectric layer, etc.) may be formed on the dielectric layer 503. The dielectric layer 509 may then be patterned and etched to form a contact hole 510 in the dielectric layer 509 so as to be aligned with the contact hole 506. A liner 511 (e.g., similar to liner 211 described above) may then be formed (e.g., conformally formed) on the dielectric layer 509 and on the sidewalls of the contact hole 510. The liner 511 may be, for example, an M1 liner.

Figure 5D:
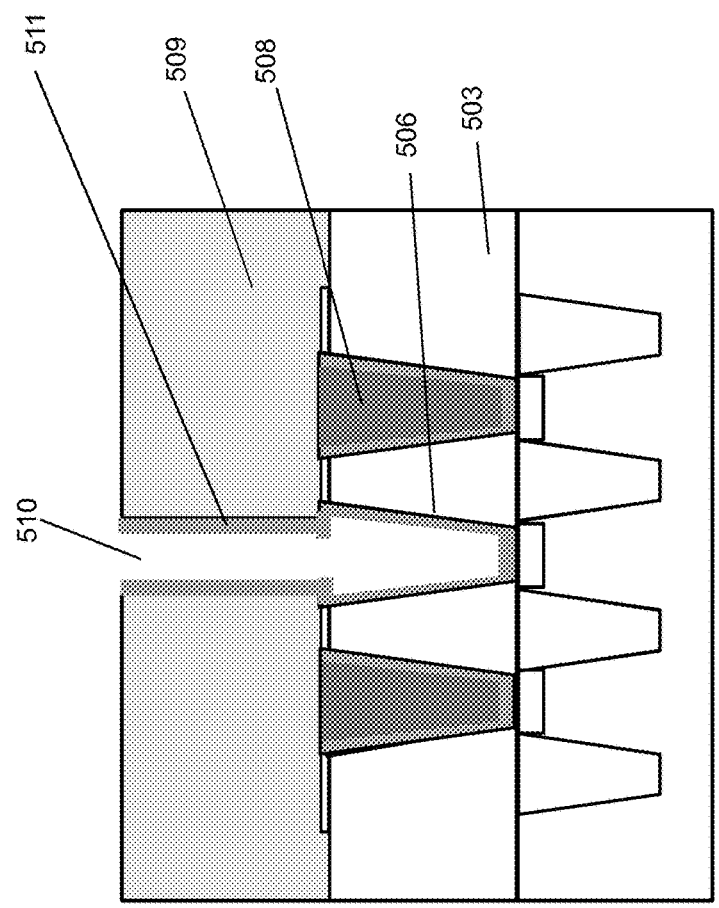
FIG. 5D illustrates the removal of the sacrificial layer 508, according to an exemplary

FIG. 5D illustrates the removal of the sacrificial layer 508, according to an exemplary aspect of the present invention.

As illustrated in FIG. 5D, the liner 511 may be removed from horizontal surfaces of the device, so that the liner 511 remains on the sidewalls of the contact hole 510 (e.g., on the sidewalls of the dielectric layer 509 (e.g., M1 dielectric layer)). For example, the liner 511 may be removed from the upper surface of the dielectric layer 509. This removal of the liner 511 may be performed, for example, by RIE.

As further illustrated in FIG. 5D, the sacrificial layer 508 may be removed from the contact hole 506, for example, by etching (e.g., selective etching).

Figure 5E:
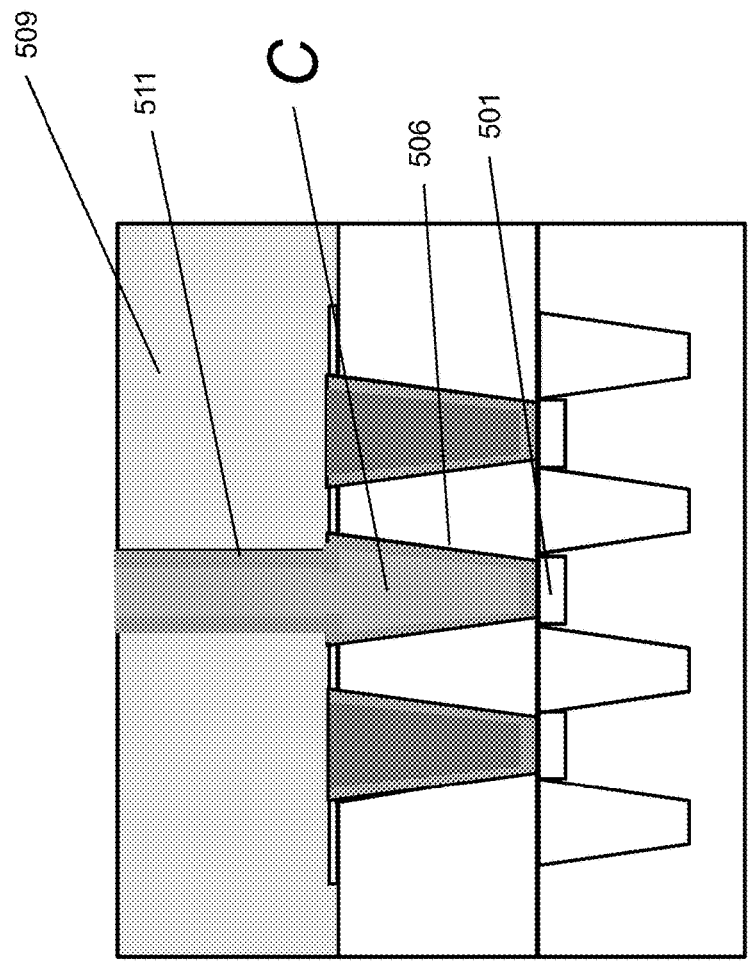
FIG. 5E illustrates the forming of the contact C, according to an exemplary aspect of the present invention.

FIG. 5E illustrates the forming of the contact C, according to an exemplary aspect of the present invention.

As illustrated in FIG. 5E, the contact C, may be formed on the liner 511 in the contact hole 506 and in the contact hole 510.

The contact C may include, for example, copper (e.g., a copper contact). That is, the contact C may include substantially pure copper or an alloy containing copper.

The contact C may be formed, for example, by depositing (e.g., flash depositing) a layer of copper on the dielectric layer 509, and then reflowing the copper into the contact hole 506 and the contact hole 510. The reflow of the copper may be performed, for example, at a temperature in a range from 200° C. to 450° C., and for a duration in a range of 30 minutes to 3 hours, and in an atmosphere including one of nitrogen and a mixture of nitrogen and hydrogen.

As illustrated in FIG. 5E, the contact C may extend continuously from near the active area 501 to near an upper surface of the dielectric layer 509. Thus, unlike the related art method in which requires two different contacts, an exemplary aspect of the present invention may fill both of the contact holes 506 and 510 with one continuously formed contact C. That is, an exemplary aspect of the present invention may provide an interface-free metal layer across a plurality of levels.

It should be noted that the contact holes 506 which are not in contact with a contact hole 510 may stay filled with the sacrificial layer 508 and the TaN liner 507. Such contact holes 506 may be used as local interconnects, but do not get a lower resistance.

As noted above, the sacrificial layer 508 may include silicon. Alternatively, the sacrificial layer 508 may include a metal such as copper or cobalt. Such a sacrificial layer 508 would allow the contact holes 506 which are not in contact with a contact hole 510 (i.e., the contact holes 506 which stay filled with the sacrificial layer 508 and the TaN liner 507 and may be used as local interconnects to have a lower resistance.

FIGS. 6A-6F illustrate a method of forming a semiconductor device, according to another exemplary aspect of the present invention.

Figure 6A:
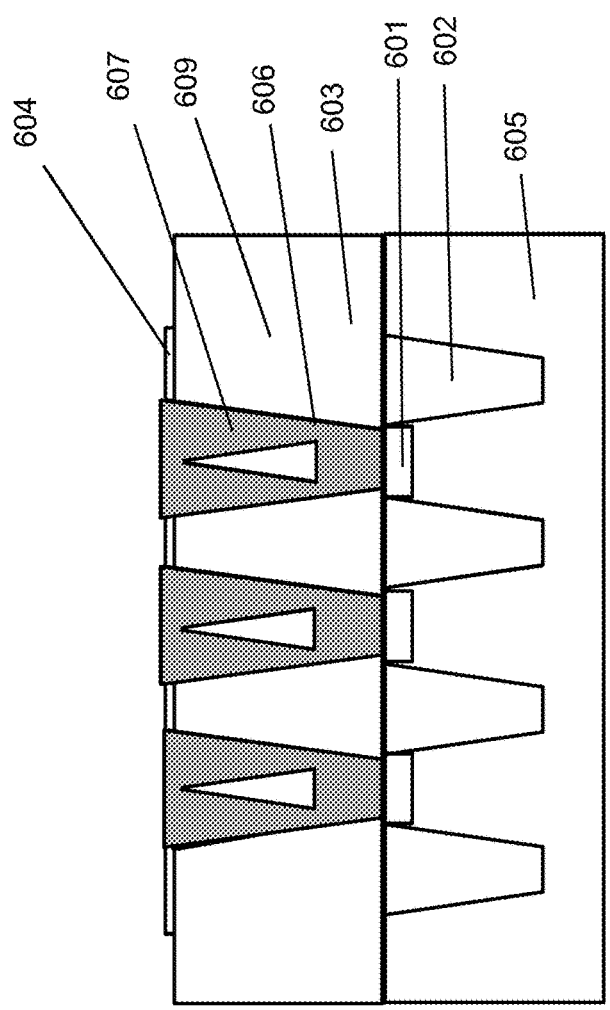
FIG. 6A illustrates the forming of a liner (e.g., TaN liner) 607, according to an exemplary aspect of the present invention.

In particular, FIG. 6A illustrates the forming of a liner (e.g., TaN liner) 607, according to an exemplary aspect of the present invention.

As illustrated in FIG. 6A, the liner 607 may be formed in a contact hole 606 which is formed in a dielectric layer 603. The steps of forming the other features of the device, such as the forming of the active layer 601 and isolation regions 602 in the substrate 605, and the forming of the nitride pad 604 and the contact hole 606 in the dielectric layer 603, are similar to the steps described above in FIGS. 2A-2F and FIGS. 5A-5E.

As also illustrated in FIG. 6A, the liner 607 is deposited in the contact hole 606 such that the liner 607 pinches off the contact hole 606. That is, the liner 607 closes the opening of the contact hole 606 and a closed space 613 or seam is formed between the walls of the liner 607 in the contact hole 606. The liner 607 is then planarized by, for example, CMP.

Figure 6B:
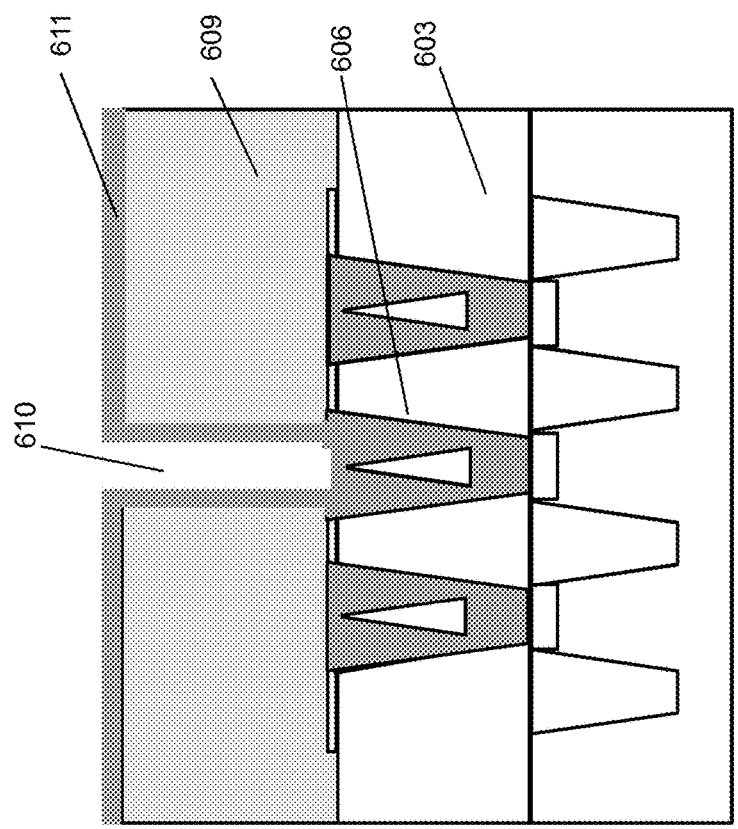
FIG. 6B illustrates the forming of a dielectric layer 609, according to an exemplary aspect of the present invention.

FIG. 6B illustrates the forming of a dielectric layer 609, according to an exemplary aspect of the present invention.

As illustrated in FIG. 6B, the dielectric layer 609 is formed on the dielectric layer 603. The dielectric layer 609 may be, for example, a V0 dielectric layer or M1 dielectric layer.

The dielectric layer 609 is patterned and etched to form a contact hole 610 which is aligned with the contact hole 606. A liner 611 is then formed (e.g., conformally formed) on the dielectric layer 609 and on the sidewalls of the contact hole 610. The liner 611 may have a configuration which is similar to that of the liner 211 illustrated above in FIG. 2E.

Figure 6C:
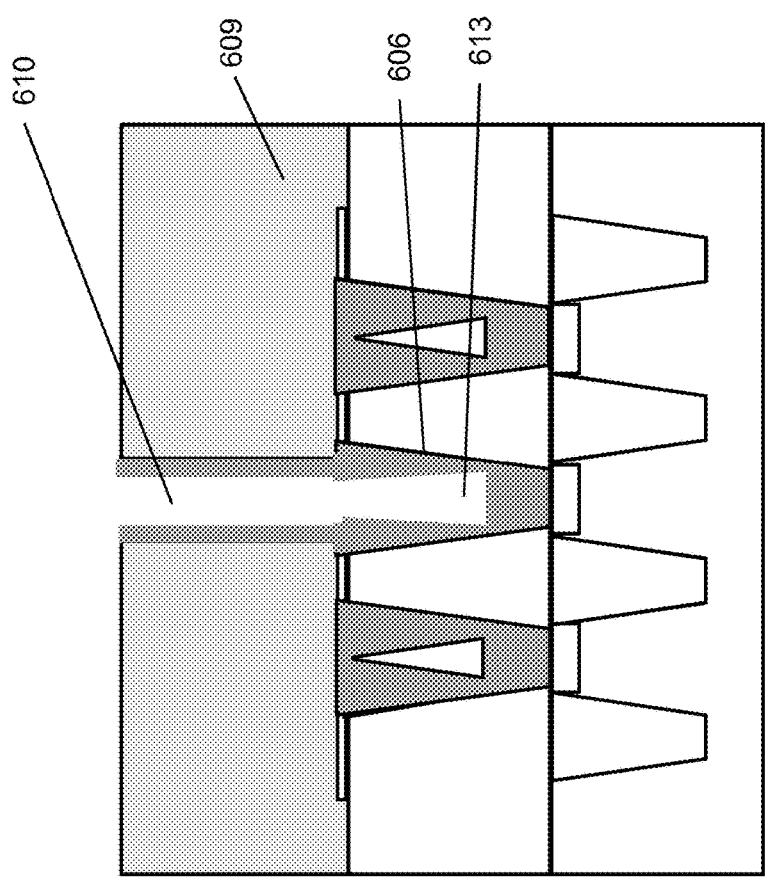
FIG. 6C illustrates removing of the liner 611, according to an exemplary aspect of the present invention.

FIG. 6C illustrates removing of the liner 611, according to an exemplary aspect of the present invention.

As illustrated in FIG. 6C, an etching (e.g., RIE) may be performed to remove the liner 611 from horizontal surfaces, such as the upper surface of the dielectric layer 609. The etching may also remove the portion of the liner 611 that "pinches off" the contact hole 606, so that the space 613 (e.g., seam) in the contact hole 606 is then open to the contact hole 610. The liner 611 remains on the sidewalls of the contact holes 606 and 610.

Figure 6D:
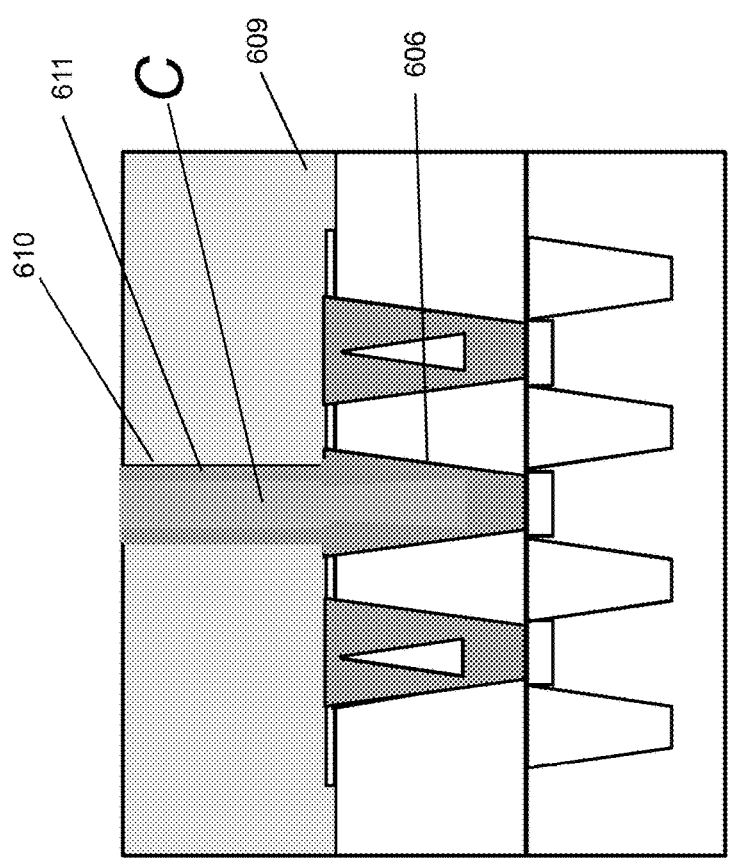
FIG. 6D illustrates the forming of the contact C, according to an exemplary aspect of the present invention.

FIG. 6D illustrates the forming of the contact C, according to an exemplary aspect of the present invention.

As illustrated in FIG. 6D, the contact C, may be formed on the liner 611 in the contact hole 606 and in the contact hole 610.

The contact C may include, for example, copper (e.g., a copper contact). That is, the contact C may include substantially pure copper or an alloy containing copper.

The contact C may be formed, for example, by depositing (e.g., flash depositing) a layer of copper on the dielectric layer 609, and then reflowing the copper into the contact hole 606 and the contact hole 610. The reflow of the copper may be performed, for example, at a temperature in a range from 200° C. to 450° C., and for a duration in a range of 30 minutes to 3 hours, and in an atmosphere including one of nitrogen and a mixture of nitrogen and hydrogen.

In short, the exemplary aspects of the present invention may provide a method of forming a low resistance contact to a device, where copper from a back end of the line (BEOL) M1 interconnect level is made part of the contact metallurgy.

A first exemplary method includes depositing a PVD TaN liner into a contact hole (CA) (e.g., contact opening), removing the TaN liner from contact hole sidewalls by anisotropic etching, filling the contact hole with silicon and planarizing the fill, performing M1 lithography (e.g., V0 lithography) to open locations for M1 to CA contact, removing the silicon from the exposed opening locations, depositing a TaN liner and a Cu wetting liner such as Co, Ru or Rh, removing the liners in the bottom of contact hole, depositing a Cu flash followed by a Cu reflow and CMP to form a Cu filled M1 (or V0)/CA contact wherein there is no liner between M1 (or V0) and CA. Contacts not connected to M1 or V0 do not have low resistance fill.

A second exemplary method includes depositing a liner (e.g., a W liner) to conformally fill a portion of the contact hole before depositing a TaN liner and a sacrificial silicon fill in the contact hole. The rest of the process is same as the first exemplary method, but the end structure includes a composite W/liner/Cu fill in the contact hold while the V0 or M1 only has a liner and Cu fill. M1 (or V0) and CA contact interface is again liner free. Contacts not connected to M1 or V0 do not have low resistance fill.

A third exemplary method includes, filling a contact hole (e.g., CA contact hole) with W/TaN and sacrificial Co/Cu (i.e., Co or Cu), removing the sacrificial Co/Cu from the contact hole connected to M1 or V0, and filling the contact hole with TaN/wetting liner/Cu, to form a liner free BEOL contact. In this embodiment all contacts have a low resistance fill (e.g., Co or Cu).

A fourth exemplary aspect is direct to a BEOL/middle of the line (MOL) contact structure, where the MOL contact includes a low resistance fill including a wetting liner to enable copper filling and copper fill or a hybrid tungsten/copper fill both formed without an intervening bottom liner interface.

With its unique and novel features, the exemplary aspects of the present invention may provide an interface-free metal layer across plurality of levels.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive method and system is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A method of forming a semiconductor device, the method comprising:

forming a sacrificial layer in a first contact hole of a first dielectric layer;

forming a second dielectric layer on the first dielectric layer, and forming a second contact hole in the second dielectric layer, the second contact hole being aligned with the first contact hole;

removing the sacrificial layer from the first contact hole;

forming a liner layer comprising a wetting liner layer on the second dielectric layer and in the first and second contact holes, wherein the forming of the liner layer comprises: forming a TaN liner layer on the second dielectric layer and in the first and second contact holes; and forming the a wetting liner layer on the TaN liner layer, wherein the wetting liner layer comprises one of Ru, Co and Rh; and depositing a copper layer on the wetting liner layer, and reflowing the copper layer into the first and second contact holes to form a copper contact in the first and second contact holes.

2. The method of claim 1, wherein the forming of the TaN liner layer and the forming of the wetting liner layer are performed using atomic layer deposition (ALD).

3. The method of claim 1, wherein the reflowing of the copper layer is performed at a temperature in a range from 200° C. to 450° C., and for a duration in a range of 30 minutes to 3 hours, and in an atmosphere including one of nitrogen and a mixture of nitrogen and hydrogen.

4. The method of claim 1, further comprising:
forming the first dielectric layer;
planarizing a surface of the first dielectric layer by chemical mechanical polishing (CMP);
forming a nitride cap on the surface of the first dielectric layer;
patterning and etching the first dielectric layer to form the first contact hole; and
depositing a TaN liner and performing etch back to remove the TaN liner from a side wall of the first contact hole.

5. The method of claim 1, wherein the first dielectric layer comprises a contact-to-active area (CA) dielectric layer, and the second dielectric layer comprises one of a V0 dielectric layer and an M1 dielectric layer.

6. The method of claim 1, wherein the first dielectric layer comprises other contact holes, and the forming of the sacrificial layer comprises forming the sacrificial layer in the other contact holes, and
wherein the second dielectric layer is formed on the other contact holes such that the sacrificial layer remains in the other contact holes.

7. A method of forming a semiconductor device, the method comprising:
forming a first liner layer in a first contact hole of a first dielectric layer;

forming a sacrificial layer on the first liner layer to fill the first contact hole;

forming a second dielectric layer on the first dielectric layer, and forming a second contact hole in the second dielectric layer, the second contact hole being aligned with the first contact hole;

forming a second liner layer comprising a wetting liner layer on the second dielectric layer and in the second contact hole, wherein the forming of the second liner layer comprises: forming a TaN liner layer on the second dielectric layer and in the first and second contact holes; and forming the a wetting liner layer on the TaN liner layer, wherein the wetting liner layer comprises one of Ru, Co and Rh;

removing the sacrificial layer from the first contact hole; and depositing a copper layer on the wetting liner layer, and reflowing the copper layer into the first and second contact holes to form a copper contact in the first and second contact holes.

8. The method of claim 7, wherein the forming of the TaN liner layer and the forming of the wetting liner layer are performed using atomic layer deposition (ALD).

9. The method of claim 7, wherein the reflowing of the copper layer is performed at a temperature in a range from 200° C. to 450° C., and for a duration in a range of 30 minutes to 3 hours, and in an atmosphere including one of nitrogen and a mixture of nitrogen and hydrogen.

10. The method of claim 7, further comprising:
forming the first dielectric layer;
planarizing a surface of the first dielectric layer by chemical mechanical polishing (CMP);
forming a nitride cap on the surface of the first dielectric layer;
patterning and etching the first dielectric layer to form the first contact hole; and
depositing a TaN liner and performing etch back to remove the TaN liner from a side wall of the first contact hole.

11. The method of claim 7, wherein the first dielectric layer comprises a contact-to-active area (CA) dielectric layer, and the second dielectric layer comprises one of a V0 dielectric layer and an M1 dielectric layer.

12. The method of claim 1, wherein the first dielectric layer comprises other contact holes, and the forming of the sacrificial layer comprises forming the sacrificial layer in the other contact holes, and
wherein the second dielectric layer is formed on the other contact holes such that the sacrificial layer remains in the other contact holes.

* * * * *